United States Patent
Hussein et al.

(10) Patent No.: US 7,414,867 B2
(45) Date of Patent: Aug. 19, 2008

(54) POWER CONVERSION DEVICE

(75) Inventors: Khalid Hassan Hussein, Tokyo (JP);
Masuo Shinohara, Fukuoka (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 11/616,104

(22) Filed: Dec. 26, 2006

(65) Prior Publication Data

US 2007/0159751 A1 Jul. 12, 2007

(30) Foreign Application Priority Data

Aug. 1, 2006 (JP) ............... 2006-209532

(51) Int. Cl.
*H02H 7/00* (2006.01)
*H02H 3/08* (2006.01)
(52) U.S. Cl. .................. 363/56.03; 361/57; 361/93.9; 361/101
(58) Field of Classification Search ............... 363/50, 363/55, 56.01, 56.05, 56.12, 56.03, 56.04, 363/124; 361/18, 56, 100, 111, 79, 86, 87, 361/88, 91.1, 93.1, 93.9, 101; 257/328, 339, 257/355, 356
See application file for complete search history.

(56) References Cited

U.S. PATENT DOCUMENTS

| | | | | |
|---|---|---|---|---|
| 4,719,531 A | * | 1/1988 | Okado et al. .................. 361/86 |
| 5,115,369 A | * | 5/1992 | Robb et al. ..................... 361/58 |
| 5,303,110 A | * | 4/1994 | Kumagai ...................... 361/18 |
| 5,444,591 A | * | 8/1995 | Chokhawala et al. ......... 361/18 |
| 6,160,691 A | * | 12/2000 | Shen et al. ..................... 361/79 |
| 6,385,028 B1 | * | 5/2002 | Kouno ......................... 361/111 |
| 6,462,382 B2 | * | 10/2002 | Yoshida et al. .............. 257/355 |
| 6,687,106 B1 | * | 2/2004 | Tanaka et al. ............... 361/101 |
| 2006/0087304 A1 | | 4/2006 | Ren et al. |

FOREIGN PATENT DOCUMENTS

| | | |
|---|---|---|
| JP | 62-143450 | 6/1987 |
| JP | 09-008620 | 1/1997 |
| JP | 11-68535 | 3/1999 |
| JP | 3067448 | 5/2000 |
| JP | 2002-157027 | 5/2002 |
| KR | 1998-040228 | 8/1998 |
| KR | 10-2005-0066122 | 6/2005 |

* cited by examiner

*Primary Examiner*—Gary L Laxton
(74) *Attorney, Agent, or Firm*—Oblon, Spivak, McClelland, Maier & Neustadt, P.C.

(57) ABSTRACT

An insulated gate bipolar transistor and a protective circuit are incorporated. The protective circuit has first and second Zener diodes connected in series in directions opposite to each other between the gate and the current sense terminal of the insulated gate bipolar transistor, and third and fourth Zener diodes connected in series in directions opposite to each other between the gate and the emitter of the insulated gate bipolar transistor.

11 Claims, 12 Drawing Sheets

FIG. 9
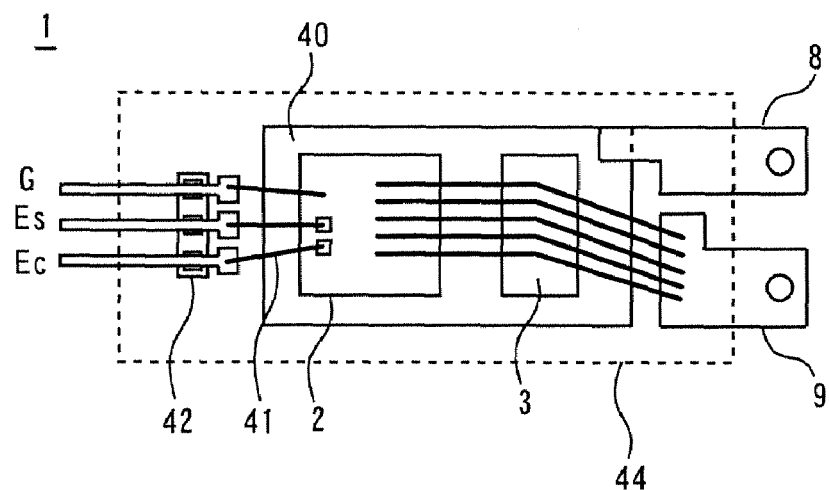
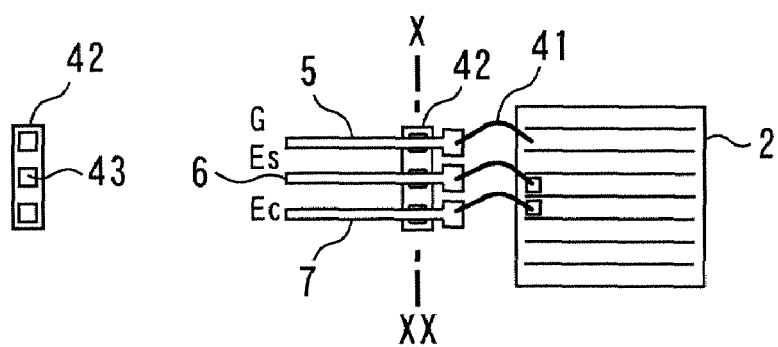
FIG. 10A   FIG. 10B   FIG. 10C

POWER CONVERSION DEVICE

BACKGROUND OF THE INVENTION

1. Field of the Invention

The present invention relates to a power conversion device such as a chopper or an inverter and, more particularly, to a power conversion device capable of preventing an insulated gate bipolar transistor from being broken by static electricity or the like.

2. Background Art

A transfer-mold power module (TPM), which is a large-current high-withstand-voltage power conversion device, is being used in intelligent power modules (IPMs) for motor vehicles because it is compact and has high reliability.

FIG. 22 is a circuit diagram showing a conventional power conversion device 1 and an external circuit 4. The power conversion device 1 incorporates an insulated gate bipolar transistor (IGBT) 2 and a free wheeling diode (FWD) 3 in a transfer-mold package. The external circuit 4 is provided outside the power conversion device 1. The gate, the current sense terminal and the emitter of the IGBT 2 are connected to the external circuit 4 via a G terminal 5, an Es terminal 6 and an Ec terminal 7, respectively. The collector and the emitter of the IGBT 2 are respectively connected to output terminals: a C terminal 8 and an E terminal 9. The free wheeling diode 3 is connected between the C terminal 8 and the E terminal 9.

The external circuit 4 has a function to drive the IGBT 2 and a function to protect the IGBT 2 from a large current caused by a short circuit for example. However, there is a problem that if the external circuit 4 has a function to protect the IGBT 2 from a large current, the delay in response to a large current is increased because of an increase in the length to the IGBT 2. There is also a problem that a malfunction occurs due to induction noise or the like.

To solve this problem, a power conversion device having, in the power conversion device 1 with the IGBT 2, a protective circuit 10 for protecting the IGBT 2 from a large current as shown in FIG. 23 has been proposed (see, for example, Japanese Patent Laid-Open No. 62-143450). This protective circuit 10 is a real time control (RTC) circuit having an NMOS transistor 11, a first resistor 12 and a first diode 13. The NMOS transistor 11 has its gate connected to the current sense terminal of the IGBT 2, its source connected to the emitter of the IGBT 2 and its drain connected to the gate of the IGBT 2 via the first diode 13. The first resistor 12 is connected between the current sense terminal and the emitter of the IGBT 2.

The NMOS transistor 11 is turned on when a large current flows through the current sense terminal of the IGBT 2 such that a threshold voltage is reached across the first resistor 12. The large current flowing through the IGBT 2 is thereby reduced or shutoff, thus preventing breakdown of the IGBT 2.

As described above, an RTC circuit is incorporated in the conventional power conversion device to prevent the insulated gate bipolar transistor from being broken by an excess current as well as to prevent a malfunction due to induction noise. In the conventional power conversion device, however, the insulated gate bipolar transistor cannot be prevented from being broken by static electricity generated during handling or testing.

SUMMARY OF THE INVENTION

In view of the above-described problem, an object of the present invention is to provide a power conversion device capable of preventing an insulated gate bipolar transistor from being broken by static electricity.

According to one aspect of the present invention, an insulated gate bipolar transistor and a protective circuit are incorporated. The protective circuit has first and second Zener diodes connected in series in directions opposite to each other between the gate and the current sense terminal of the insulated gate bipolar transistor, and third and fourth Zener diodes connected in series in directions opposite to each other between the gate and the emitter of the insulated gate bipolar transistor.

The present invention makes it possible to prevent an insulated gate bipolar transistor from being broken by static electricity.

Other and further objects, features and advantages of the invention will appear more fully from the following description.

BRIEF DESCRIPTION OF THE DRAWINGS

FIG. 9 is a top view of a power conversion device according to a ninth embodiment of the present invention.

FIG. 10A is a top view of a protective circuit.

FIG. 10B is a top view of a state in which a protective chip is joined to the power conversion device according to the ninth embodiment of the present invention.

FIG. 10C is a sectional view taken along line X-XX in FIG. 10B.

DETAILED DESCRIPTION OF THE PREFERRED EMBODIMENTS

First Embodiment

Figure 1:
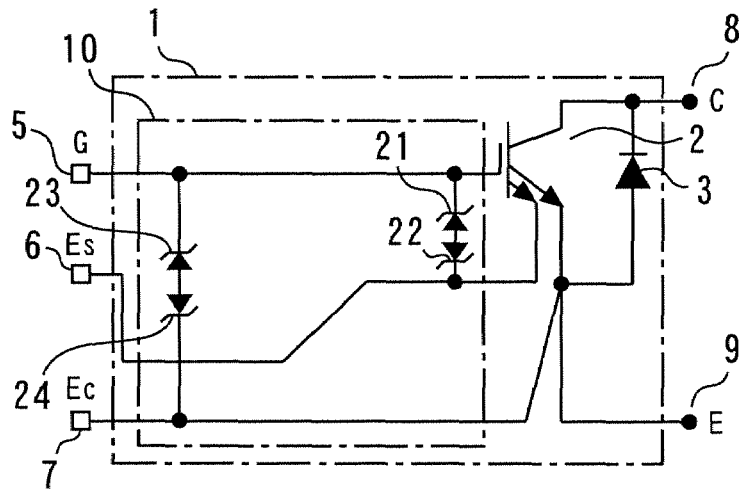
FIG. 1 is a circuit diagram showing a power conversion device according to a first embodiment of the present invention.

FIG. 1 is a circuit diagram showing a power conversion device according to a first embodiment of the present invention. A power conversion device 1 incorporates an IGBT 2, a free wheeling diode 3 and a protective circuit 10 in a transfer-mold package. The gate, the current sense terminal and the emitter of the IGBT 2 are respectively connected to external terminals: a G terminal 5, an Es terminal 6 and an Ec terminal 7. The collector and the emitter of the IGBT 2 are respectively connected to output terminals: a C terminal 8 and an E terminal 9. The free wheeling diode 3 is connected between the C terminal 8 and the E terminal 9.

The protective circuit 10 has first and second Zener diodes 21 and 22 connected in series in directions opposite to each other between the gate and the current sense terminal of the IGBT 2, and third and fourth Zener diodes 23 and 24 connected in series in directions opposite to each other between the gate and the emitter of the IGBT 2. The Zener voltage of the first and second Zener diodes 21 and 22 is higher than a control voltage applied between the gate and the current sense terminal of the IGBT 2 and is lower than the breakdown voltage between the gate and the current sense terminal. The Zener voltage of the third and fourth Zener diodes 23 and 24 is higher than a control voltage applied between the gate and the emitter of the IGBT 2 and is lower than the breakdown voltage between the gate and the emitter.

When the power conversion device 1 is subjected to static electricity, the first to fourth Zener diodes 21 to 24 clamp the voltages at the terminals to safe values to prevent breakdown of the IGBT 2. Also, the connection of the current sense terminal to an external terminal enables the excess current trip level to be adjusted from the outside.

Second Embodiment

Figure 2:
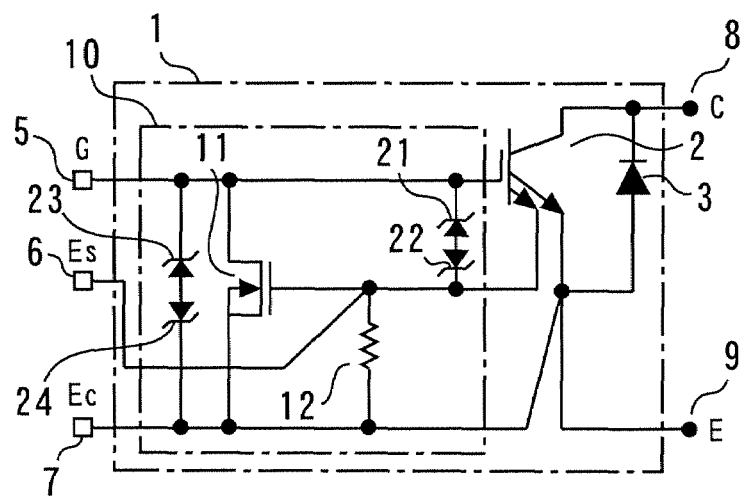
FIG. 2 is a circuit diagram showing a power conversion device according to a second embodiment of the present invention.

FIG. 2 is a circuit diagram showing a power conversion device according to a second embodiment of the present invention. The protective circuit 10 further has an NMOS transistor 11 having its gate connected to the current sense terminal of the IGBT 2, its source connected to the emitter of the IGBT 2 and its drain connected to the gate of the IGBT 2, and a first resistor 12 connected between the current sense terminal and the emitter of the IGBT 2. In other respects, the configuration is the same as that of the first embodiment.

The NMOS transistor 11 is turned on when a large current flows through the current sense terminal of the IGBT 2 such that a threshold voltage is reached across the first resistor 12. The large current flowing through the IGBT 2 is thereby reduced or shut off to prevent breakdown of the IGBT 2. Also, because the protective circuit 10 is integrated with the power conversion device in one package, the length of wiring between the current sense terminal of the IGBT 2 and the gate of the NMOS transistor 11 is reduced, so that the response to a large current is improved and a malfunction due to induction noise can be prevented.

Third Embodiment

Figure 3:
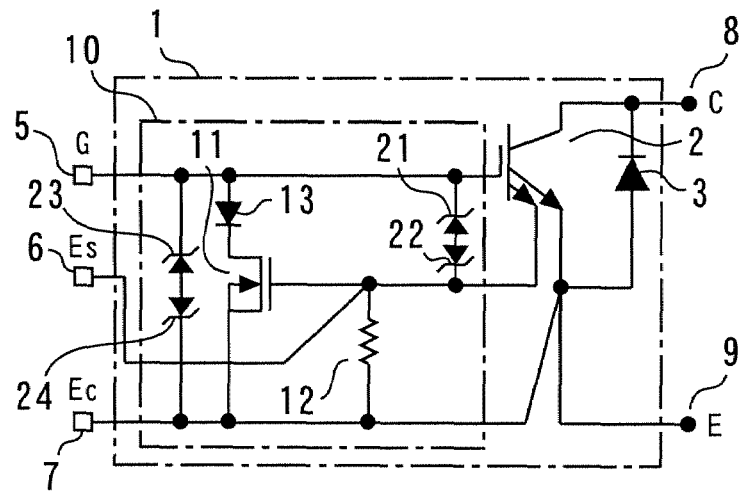
FIG. 3 is a circuit diagram showing a power conversion device according to a third embodiment of the present invention.

FIG. 3 is a circuit diagram showing a power conversion device according to a third embodiment of the present invention. The protective circuit 10 further has a first diode 13 connected between the gate of the IGBT 2 and the drain of the NMOS transistor 11. In other respects, the configuration is the same as that of the second embodiment. This arrangement ensures that the NMOS transistor 11 is protected even from application of a negative voltage between the G terminal 5 and the Ec terminal 7.

Fourth Embodiment

Figure 4:
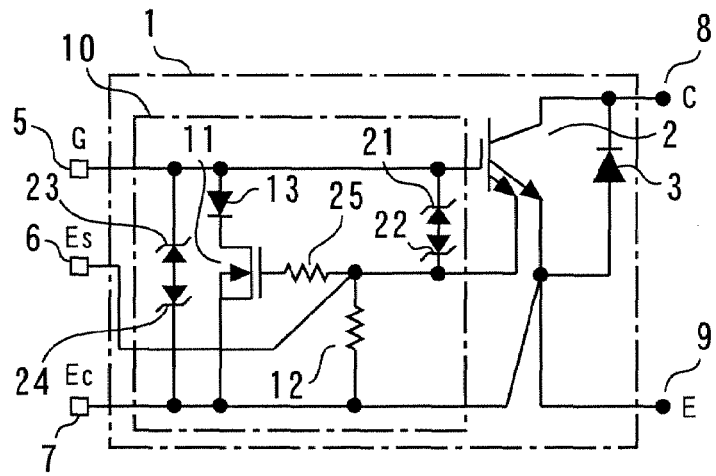
FIG. 4 is a circuit diagram showing a power conversion device according to a fourth embodiment of the present invention.

FIG. 4 is a circuit diagram showing a power conversion device according to a fourth embodiment of the present invention. The protective circuit 10 further has a second resistor 25 connected between the current sense terminal of the IGBT 2 and the gate of the NMOS transistor 11. In other respects, the configuration is the same as that of the third embodiment. This arrangement ensures that the NMOS transistor 11 is protected from a large current flowing through the gate.

Fifth Embodiment

Figure 5:
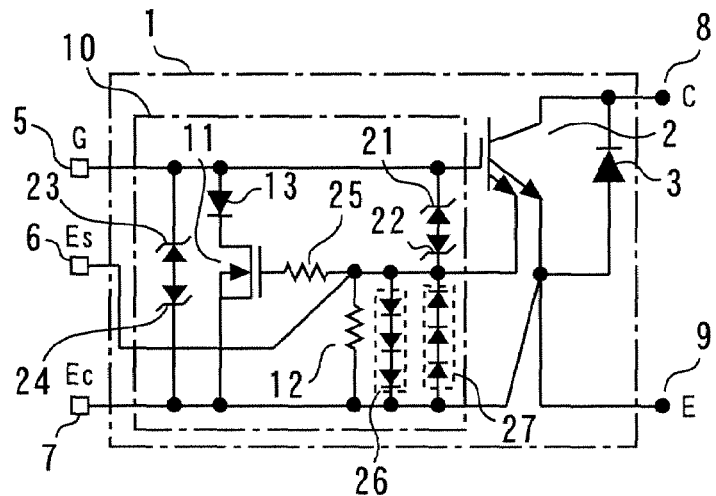
FIG. 5 is a circuit diagram showing a power conversion device according to a fifth embodiment of the present invention.

FIG. 5 is a circuit diagram showing a power conversion device according to a fifth embodiment of the present invention. The protective circuit 10 further has a first diode group 26 formed of a plurality of diodes connected in series between the current sense terminal and the emitter of the IGBT 2, and a second diode group 27 which is formed of a plurality of diodes connected in series, and which is connected in parallel with the first diode group 26 in the direction opposite to the direction of connection of the first diode group 26. The minimum value of the forward voltage across the first diode group 26 is higher than the threshold voltage of the NMOS transistor 11. Also, the maximum value of the forward voltage across the first diode group 26 is lower than the reverse withstand voltage of the second diode group 27 and is lower than the breakdown voltage between the current sense terminal and the emitter of the IGBT 2. In other respects, the configuration is the same as that of the first, second, third or fourth embodiment.

When the power conversion device 1 is subjected to static electricity, the first and second diode groups 26 and 27 clamp the voltage between the current sense terminal and the emitter of the IGBT 2 to a safe value (for example, in the range from 2 to 3 V) to prevent breakdown of the IGBT 2.

Sixth Embodiment

Figure 6:
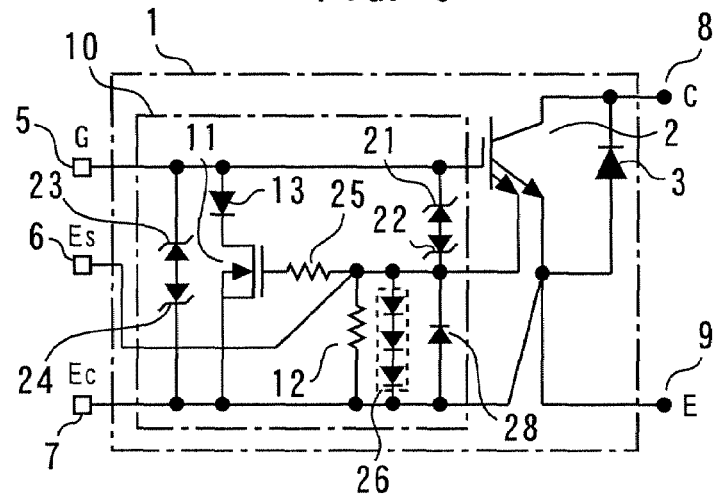
FIG. 6 is a circuit diagram showing a power conversion device according to a sixth embodiment of the present invention.

FIG. 6 is a circuit diagram showing a power conversion device according to a sixth embodiment of the present invention. The protective circuit 10 further has a first diode group 26 formed of a plurality of diodes connected in series between the current sense terminal and the emitter of the IGBT 2, and a second single diode 28 connected in parallel with the first diode group 26 in the direction opposite to the direction of connection of the first diode group 26. The anode of the second diode 28 is connected to the emitter of the IGBT 2, while the cathode is connected to the current sense terminal of the IGBT 2. The maximum value of the forward voltage across the first diode group 26 is lower than the reverse withstand voltage of the second diode 28. In other respects, the configuration is the same as that of the first, second, third or fourth embodiment.

When the power conversion device 1 is subjected to static electricity, the first diode group 26 and the second single diode 28 clamp the voltage between the current sense terminal and the emitter of the IGBT 2 to a safe value to prevent breakdown of the IGBT 2.

Seventh Embodiment

Figure 7:
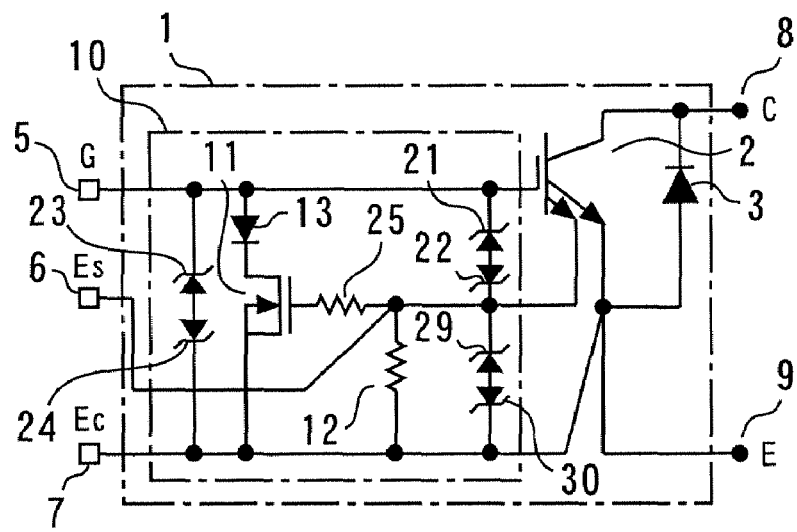
FIG. 7 is a circuit diagram showing a power conversion device according to a seventh embodiment of the present invention.

FIG. 7 is a circuit diagram showing a power conversion device according to a seventh embodiment of the present invention. The protective circuit 10 further has a fifth and sixth Zener diodes 29 and 30 connected in series in directions opposite to each other between the current sense terminal and the emitter of the IGBT 2. The Zener voltage of the fifth and sixth Zener diodes 29 and 30 is higher than the threshold voltage of the NMOS transistor 11 and is lower than the breakdown voltage between the current sense terminal and the emitter of the IGBT 2. In other respects, the configuration is the same as that of the first, second, third or fourth embodiment.

When the power conversion device 1 is subjected to static electricity, the fifth and sixth Zener diodes 29 and 30 clamp the voltage between the current sense terminal and the emitter of the IGBT 2 to a safe value to prevent breakdown of the IGBT 2.

Eighth Embodiment

Figure 8:
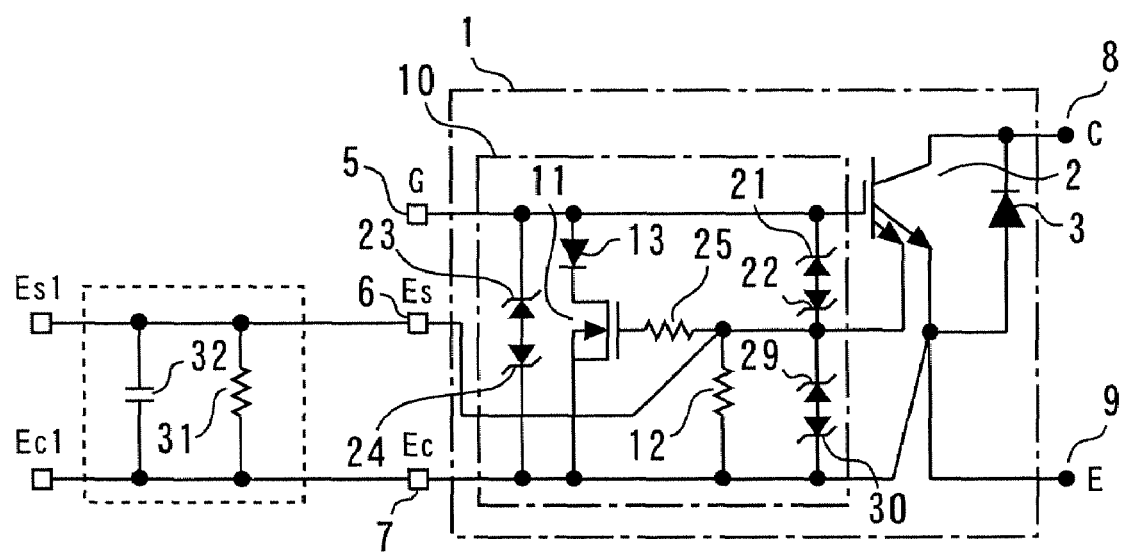
FIG. 8 is a circuit diagram showing a power conversion device according to an eighth embodiment of the present invention.

FIG. 8 is a circuit diagram showing a power conversion device according to an eighth embodiment of the present invention. An external resistor 31 or an external capacitor 32 connected in parallel with the first resistor is further provided. In other respects, the configuration is the same as that of the second, third, fourth, fifth, sixth or seventh embodiment. By means of the external resistor 31, the resistance value of the integrated resistor 12 (i.e., the large-current trip level) can be adjusted from the outside. Also, noise components contained in the current sense signal can be filtered by the external capacitor 32.

Ninth Embodiment

FIG. 9 is a top view of a power conversion device according to a ninth embodiment of the present invention. FIG. 10A is a top view of a protective circuit; FIG. 10B is a top view of a state in which a protective chip is joined to the power conversion device 1 according to the ninth embodiment of the present invention; and FIG. 10C is a sectional view taken along line X-XX in FIG. 10B.

The IGBT 2 and the free wheeling diode 3 are mounted on a metal block 40. The gate, the current sense terminal and the emitter of the IGBT 2 are respectively wire bonded through wires 41 to upper surfaces of external terminals: G terminal 5, Es terminal 6 and Ec terminal 7. A protective chip 42 on which the protective circuit 10 is formed is directly bonded to lower surfaces of the G terminal 5, the Es terminal 6 and the Ec terminal 7 by means of solder balls 43. All these components are transfer molded in a molding resin 44. The protective chip 42 is thus directly bonded to the external terminals to enable the power conversion device to be made compact.

Tenth Embodiment

Figure 11A:
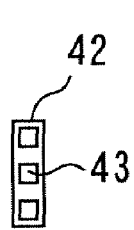
FIG. 11A is a top view of a protective circuit.
Figure 11B:
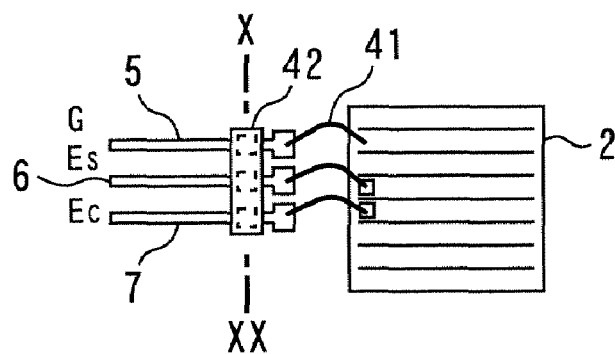
FIG. 11B is a top view of a state in which a protective chip is joined to a power conversion device according to a tenth embodiment of the present invention.
Figure 11C:
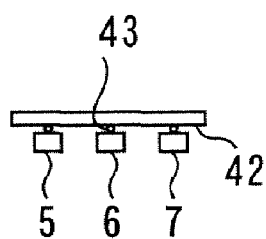
FIG. 11C is a sectional view taken along line X-XX in FIG. 11B.

FIG. 11A is a top view of a protective circuit; FIG. 11B is a top view of a state in which a protective chip is joined to a power conversion device according to a tenth embodiment of the present invention; and FIG. 11C is a sectional view taken along line X-XX in FIG. 11B.

The protective chip 42 on which the protective circuit 10 is formed is directly bonded, in an inverted state, by means of solder balls 43, to upper surfaces of external terminals: G terminal 5, Es terminal 6 and Ec terminal 7 respectively connected to the gate, the current sense terminal and the emitter of the IGBT 2. In this way, the protective chip 42 can be more easily bonded directly to the external terminals in comparison with the ninth embodiment.

Eleventh Embodiment

Figure 12:
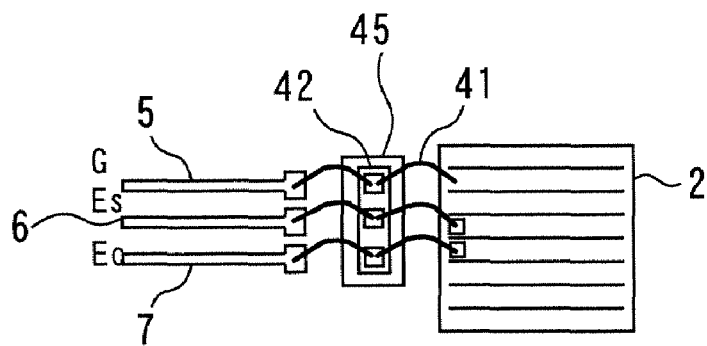
FIG. 12 is a top view of a state in which a protective chip is joined to a power conversion device according to an eleventh embodiment of the present invention.

FIG. 12 is a top view of a state in which a protective chip is joined to a power conversion device according to an eleventh embodiment of the present invention. The protective chip 42 on which the protective circuit 10 is formed is mounted on a separate metal block 45 and is wire bonded through wires 11 to the gate, the current sense terminal and the emitter of the IGBT 2 and to external terminals: G terminal 5, Es terminal 6 and Ec terminal 7. Thus, the present invention can be applied to any device having the protective chip 42 and external terminals wire bonded to each other regardless of the coupling configuration between the protective chip 42 and the external terminals.

Twelfth Embodiment

Figure 13:
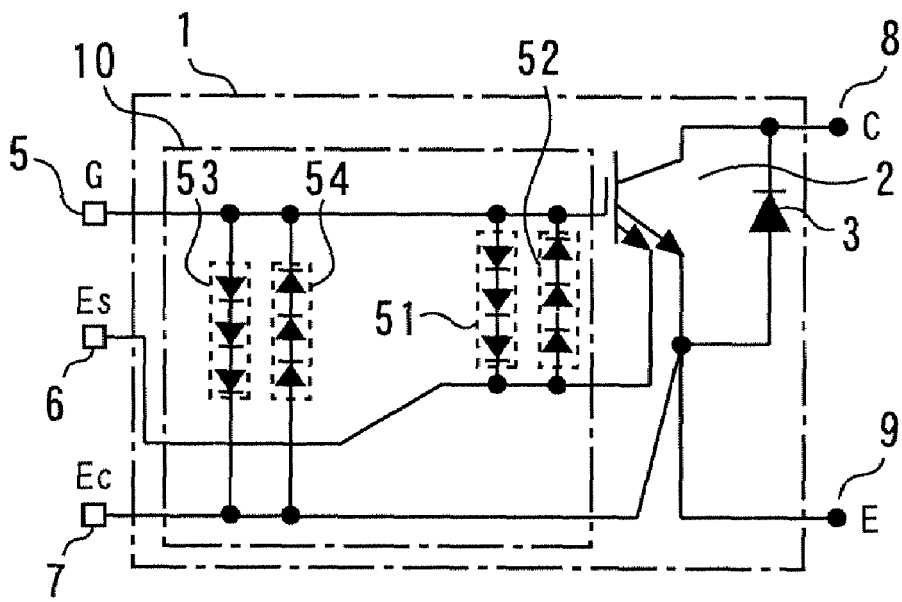
FIG. 13 is a circuit diagram showing a power conversion device according to a twelfth embodiment of the present invention.

FIG. 13 is a circuit diagram showing a power conversion device according to a twelfth embodiment of the present invention. The protective circuit 10 has a first diode group 51 formed of a plurality of diodes connected in series between the gate and the current sense terminal of the IGBT 2, a second diode group 52 which is formed of a plurality of diodes connected in series, and which is connected in parallel with the first diode group 51 in the direction opposite to the direction of connection of the first diode group 51, a third diode group 53 formed of a plurality of diodes connected in series between the gate and the emitter of the IGBT 2, and a fourth diode group 54 which is formed of a plurality of diodes connected in series, and which is connected in parallel with the third diode group 53 in the direction opposite to the direction of connection of the third diode group 53. The minimum value of the forward voltage across the first and second diode groups 51 and 52 is higher than a control voltage applied between the gate and the current sense terminal of the IGBT 2 and is lower than the breakdown voltage between the gate and the current sense terminal of the IGBT 2. Also, the minimum value of the forward voltage across the third and fourth diode groups 53 and 54 is higher than a control voltage applied between the gate and the emitter of the IGBT 2 and is lower than the breakdown voltage between the gate and the emitter of the IGBT 2.

Groups of series diodes are used in this way to improve the degree of freedom of setting the clamp voltage between the gate and the current sense terminal of the IGBT 2. Also, the groups of series diodes enable adjustment of the clamp voltage at a lower gain in comparison with the Zener diodes. Therefore, this embodiment is capable of preventing breakdown of the IGBT 2 more effectively than the first embodiment. However, the leak current through the groups of series diodes is higher than that through the Zener diodes.

Thirteenth Embodiment

Figure 14:
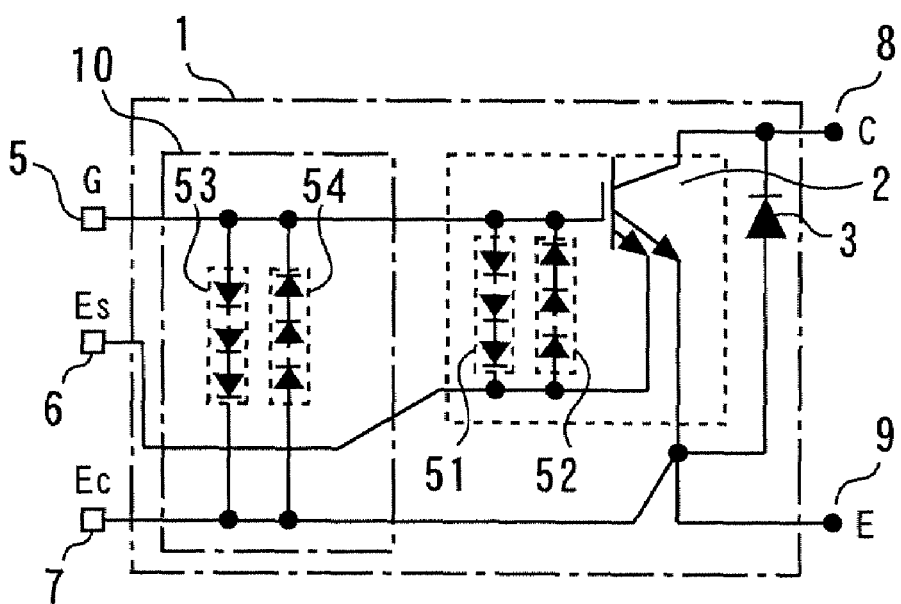
FIG. 14 is a circuit diagram showing a power conversion device according to a thirteenth embodiment of the present invention.

FIG. 14 is a circuit diagram showing a power conversion device according to a thirteenth embodiment of the present invention. The first and second diode groups 51 and 52 are integrated with the IGBT 2. In other respects, the configuration is the same as that of the twelfth embodiment. This embodiment has the same advantage as the twelfth embodiment.

Fourteenth Embodiment

Figure 15:
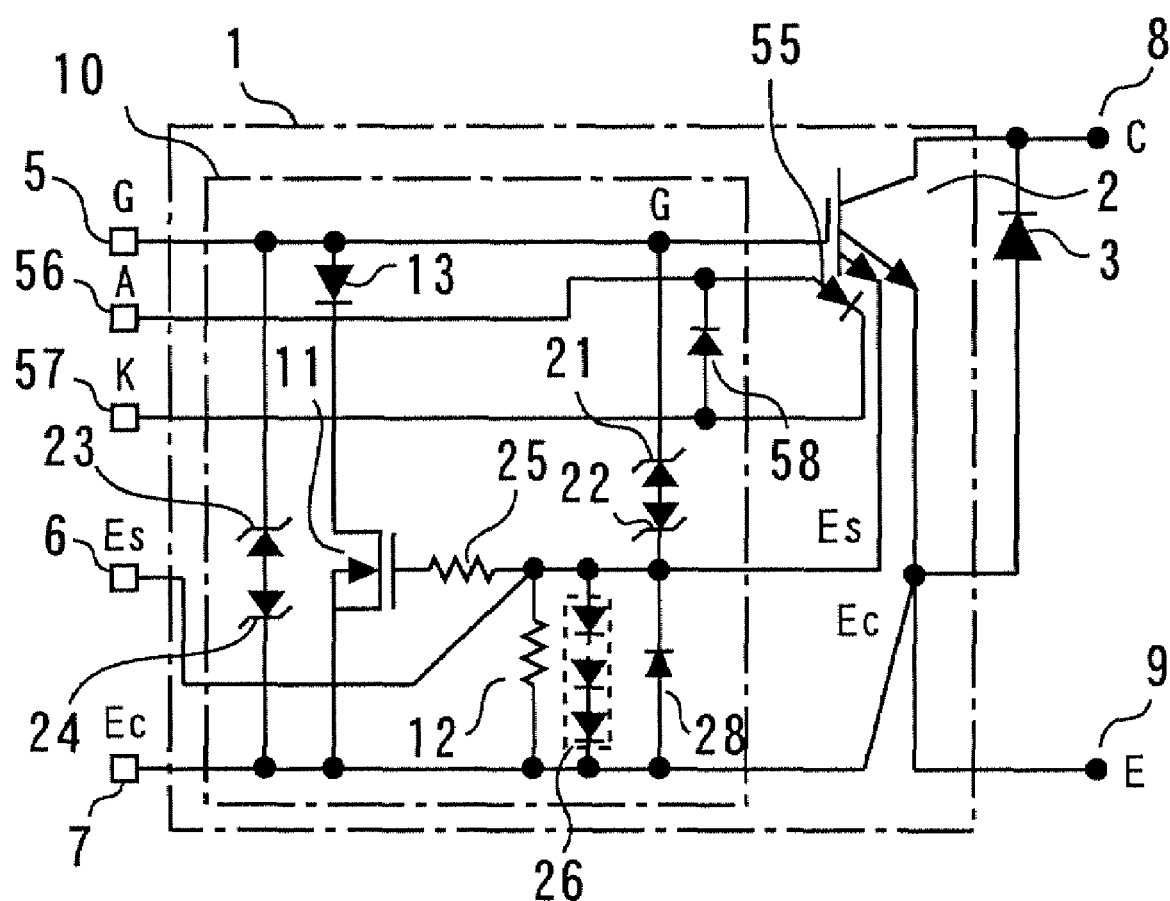
FIG. 15 is a circuit diagram showing a power conversion device according to a fourteenth embodiment of the present invention.

FIG. 15 is a circuit diagram showing a power conversion device according to a fourteenth embodiment of the present invention. The power conversion device 1 further has a temperature measuring diode 55 in the vicinity of the IGBT 2. In other respects, the configuration is the same as that of the sixth embodiment. The anode and the cathode of the temperature measuring diode 55 are respectively connected to external terminals: an A terminal 56 and a K terminal 57 and are accessible from the outside. The protective circuit 10 further has a third diode 58 having its cathode connected to the anode of the temperature measuring diode 55 and its anode connected to the cathode of the temperature measuring diode 55. The third diode 58 protects the temperature measuring diode 55 from static electricity.

Fifteenth Embodiment

Figure 16A:
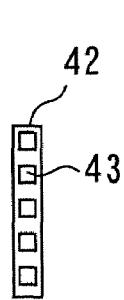
FIG. 16A is a top view of a protective circuit.
Figure 16B:
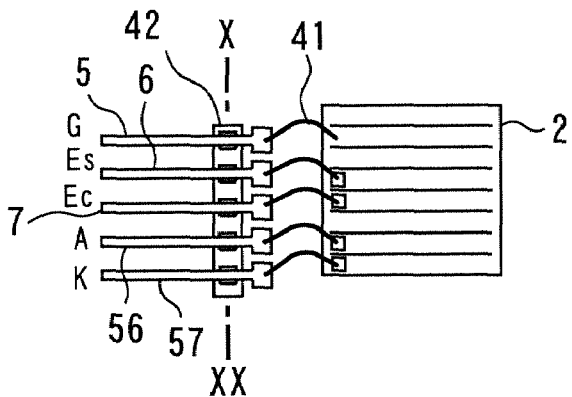
FIG. 16B is a top view of a state in which a protective chip is joined to a power conversion device according to a fifteenth embodiment of the present invention.
Figure 16C:
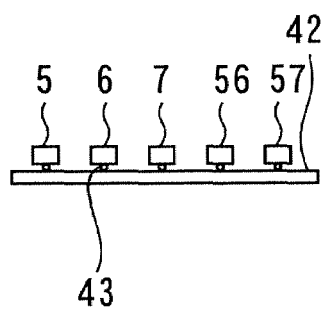
FIG. 16C is a sectional view taken along line X-XX in FIG. 16B.

FIG. 16A is a top view of a protective circuit; FIG. 16B is a top view of a state in which a protective chip is joined to a power conversion device according to a fifteenth embodiment of the present invention; and FIG. 16C is a sectional view taken along line X-XX in FIG. 16B.

The IGBT 2 and the free wheeling diode 3 are mounted on a metal block 40. The gate, the current sense terminal and the emitter of the IGBT 2 and the anode and the cathode of the temperature measuring diode 55 are respectively wire bonded through wires 41 to upper surfaces of external terminals: G terminal 5, Es terminal 6, Ec terminal 7, A terminal 56 and K terminal 57. The protective chip 42 on which the protective circuit 10 is formed is directly bonded to lower surfaces of the G terminal 5, the Es terminal 6, the Ec terminal 7, the A terminal 56 and the K terminal 57 by means of solder balls 43.

All these components are transfer molded in a molding resin 44. The protective chip 42 is thus directly bonded to the external terminals to enable the power conversion device to be made compact.

Sixteenth Embodiment

Figure 17A:
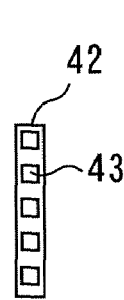
FIG. 17A is a top view of a protective circuit.
Figure 17B:
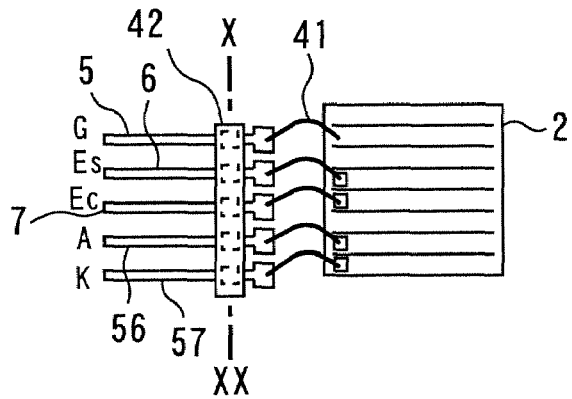
FIG. 17B is a top view of a state in which a protective chip is joined to a power conversion device according to a sixteenth embodiment of the present invention.
Figure 17C:
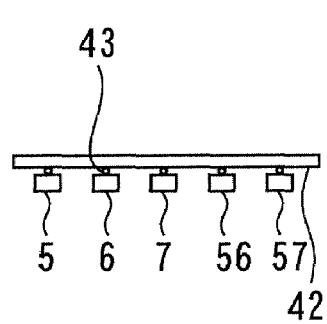
FIG. 17C is a sectional view taken along line X-XX in FIG. 17B.

FIG. 17A is a top view of a protective circuit; FIG. 17B is a top view of a state in which a protective chip is joined to a power conversion device according to a sixteenth embodiment of the present invention; and FIG. 17C is a sectional view taken along line X-XX in FIG. 17B.

The protective chip 42 on which the protective circuit 10 is formed is directly bonded, in an inverted state, by means of solder balls 43, to upper surfaces of external terminals: G terminal 5, Es terminal 6, Ec terminal 7, A terminal 56 and K terminal 57 respectively connected to the gate, the current sense terminal and the emitter of the IGBT 2 and the anode and the cathode of the temperature measuring diode 55. In this way, the protective chip 42 can be more easily bonded directly to the external terminals in comparison with the ninth embodiment.

Seventeenth Embodiment

Figure 18:
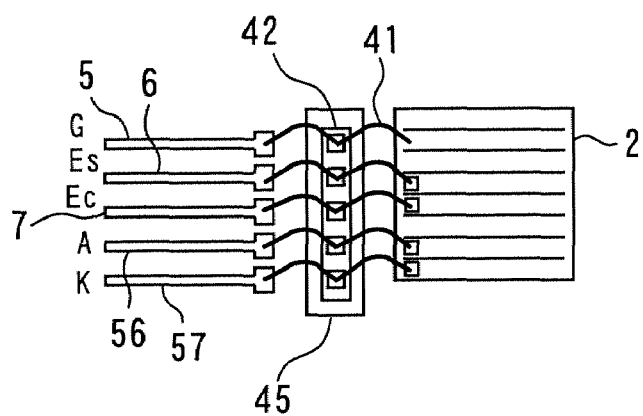
FIG. 18 is a top view of a state in which a protective chip is joined to a power conversion device according to an eleventh embodiment of the present invention.

FIG. 18 is a top view of a state in which a protective chip is joined to a power conversion device according to an eleventh embodiment of the present invention. The protective chip 42 on which the protective circuit 10 is formed is mounted on a separate metal block 45 and is wire bonded through wires 41 to the gate, the current sense terminal and the emitter of the IGBT 2, to the anode and the cathode of the temperature measuring diode 55, and to external terminals: G terminal 5, Es terminal 6, Ec terminal 7, A terminal 56 and K terminal 57. Thus, the present invention can be applied to any device having the protective chip 42 and external terminals wire bonded to each other regardless of the coupling configuration between the protective chip 42 and the external terminals.

Eighteenth Embodiment

Figure 19:
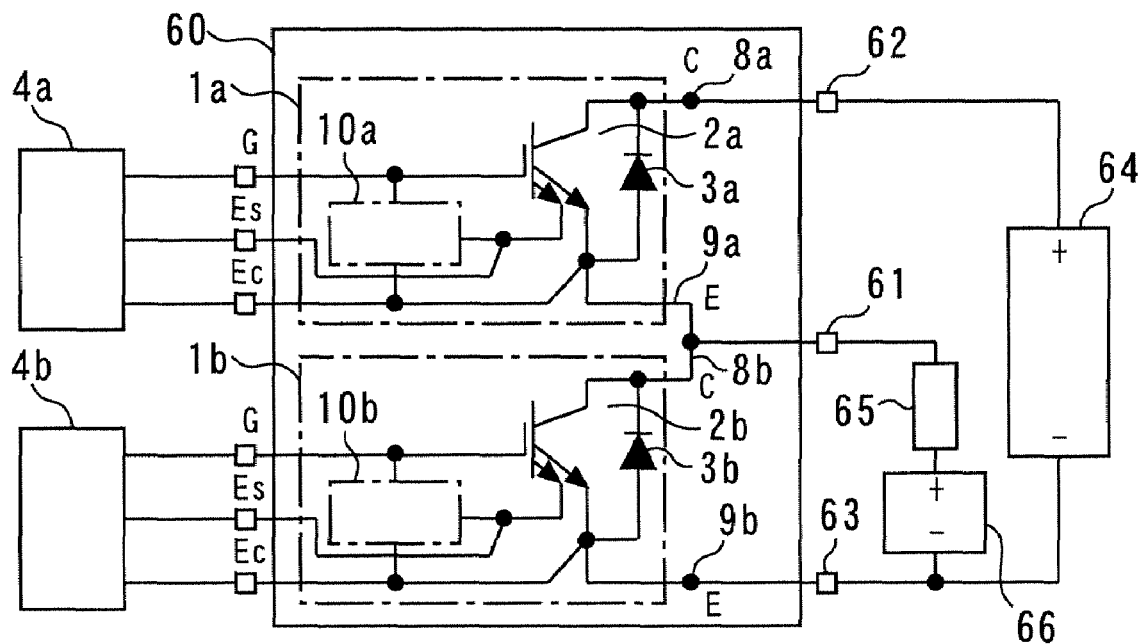
FIG. 19 is a circuit diagram showing a half-bridge chopper to which the power conversion device according to one of the embodiments of the present invention is applied.

FIG. 19 is a circuit diagram showing a half-bridge chopper to which the power conversion device according to one of the embodiments of the present invention is applied. Two power conversion devices 1a, 1b are connected in series to form a half-bridge circuit 60. The E terminal of the upper power conversion device 1a and the C terminal of the lower power conversion device 1b are connected to each other to form a central connection terminal 61 of the half-bridge circuit 60. Also, the C terminal of the upper power conversion device 1a forms a high-potential terminal 62 of the half-bridge circuit 60, while the E terminal of the lower power conversion device 1b forms a low-potential terminal 63 of the half-bridge circuit 60.

The high-potential terminal 62 is externally connected to a first direct current power supply 64 on the high-potential side of the same, while the low-potential terminal 63 is externally connected to the first direct current power supply 64 on the low-potential side of the same. The central connection terminal 61 is externally connected to one end of a load 65. The other end of the load 65 is externally connected to a second direct current power supply 66 on the high-potential side of the same. The second direct current power supply 66 is externally connected on its low-potential side to the low-potential terminal 63.

Nineteenth Embodiment

Figure 20:
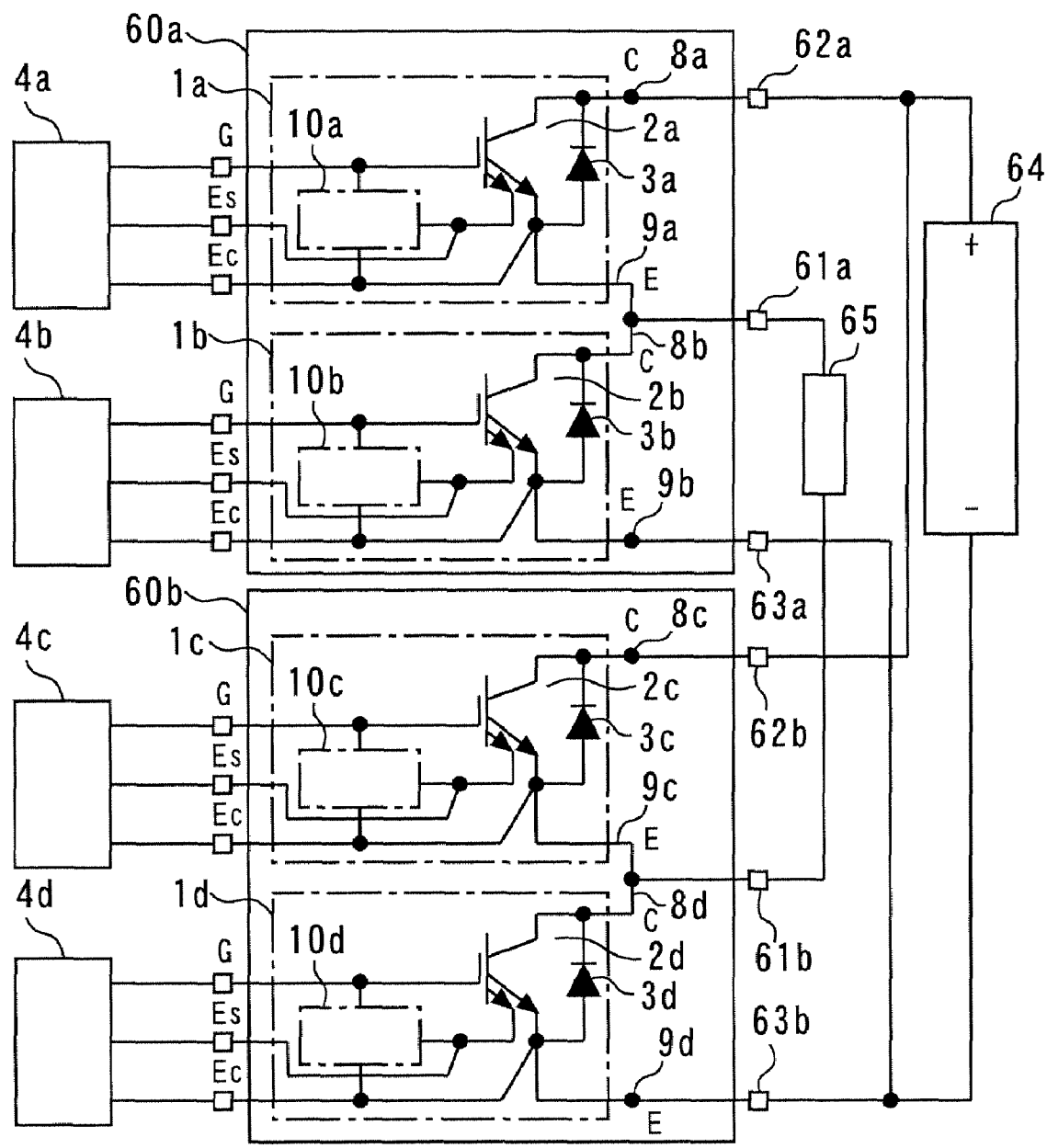
FIG. 20 is a circuit diagram showing a single-phase full bridge inverter to which the power conversion device according to one of the embodiments of the present invention is applied.

FIG. 20 is a circuit diagram showing a single-phase full bridge inverter to which the power conversion device according to one of the embodiments of the present invention is applied. Two half-bridge circuits 60a, 60b are connected in parallel with each other. The high-potential terminals 62a, 62b of the two half-bridge circuits 60a, 60b are connected to each other to form a high-potential terminal externally connected to a first direct current power supply 64 on the high-potential side of the same. The low-potential terminals 63a, 63b of the two half-bridge circuits 60a, 60b are connected to each other to form a low-potential terminal externally connected to the first direct current power supply 64 on the low-potential side of the same. The central connection terminals 61a, 61b of the two half-bridge circuits 60a, 60b are externally connected respectively to different terminals of a load 65.

Twentieth Embodiment

Figure 21:
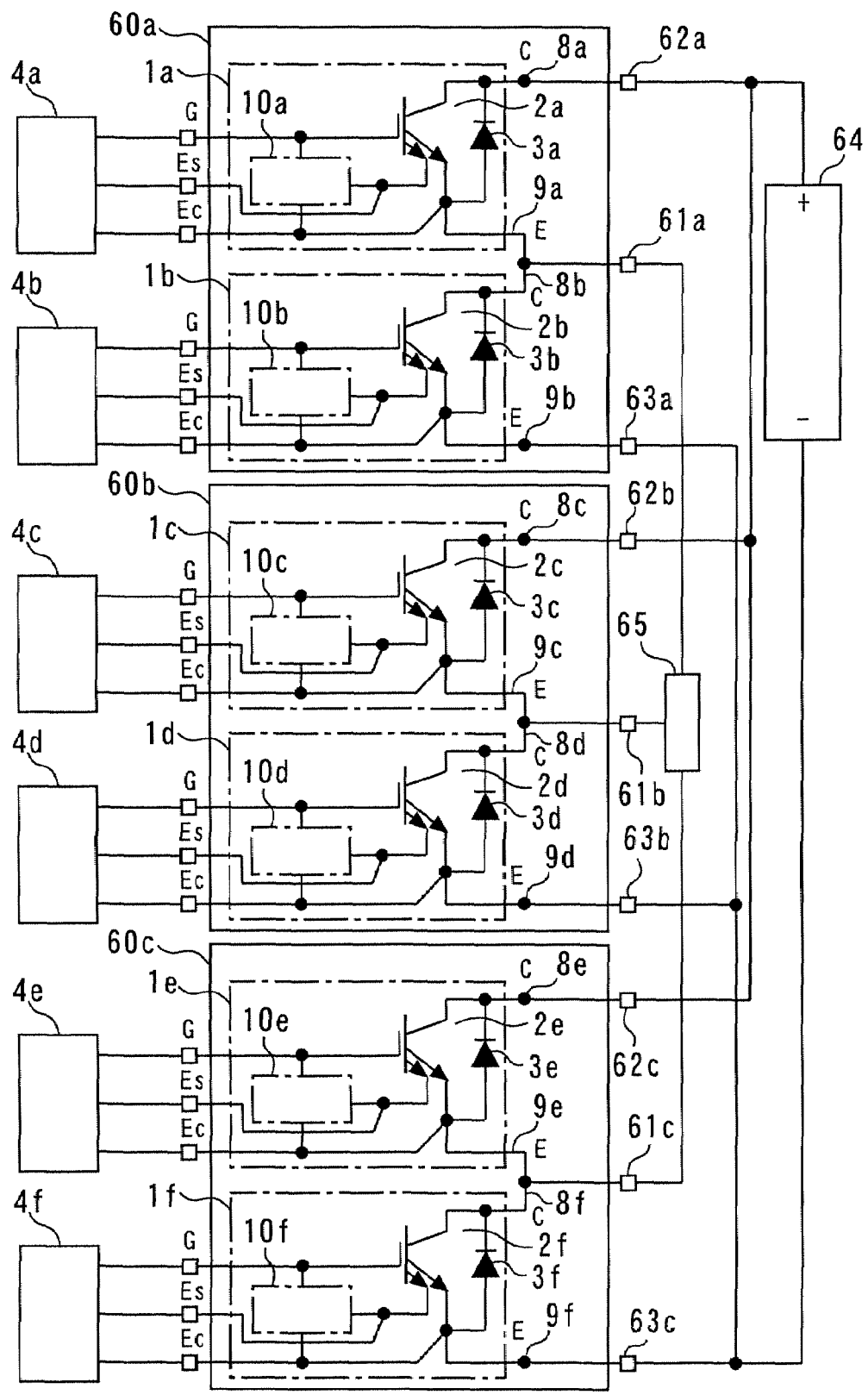
FIG. 21 is a circuit diagram showing a three-phase full-bridge inverter to which the power conversion device according to one of the embodiments of the present invention is applied.
Figure 22:
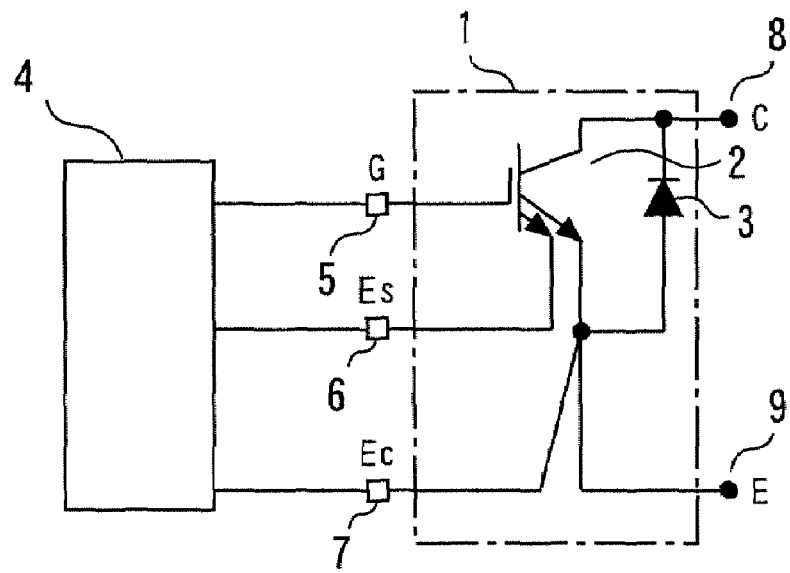
FIG. 22 is a circuit diagram showing a conventional power conversion device 1 and an external circuit.
Figure 23:
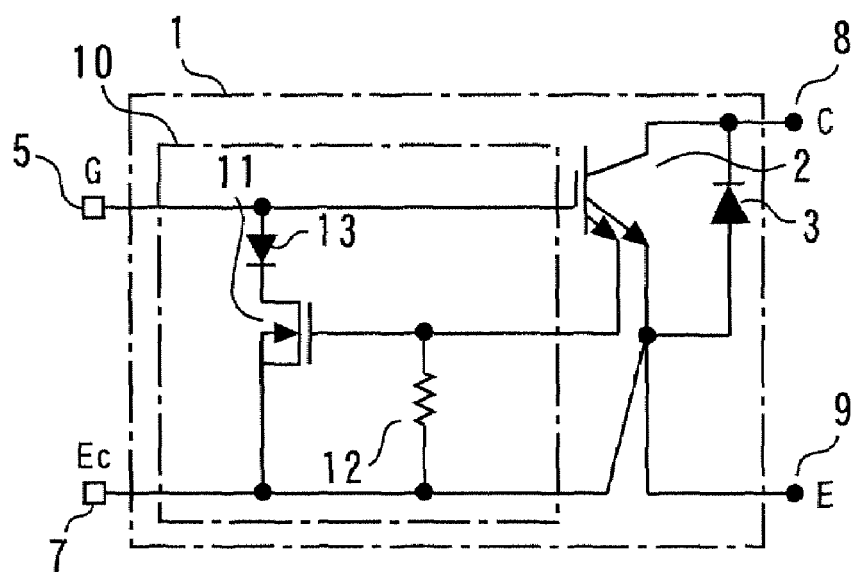
FIG. 23 is a circuit diagram showing a conventional power conversion device comprising a RTC circuit.

FIG. 21 is a circuit diagram showing a three-phase full-bridge inverter to which the power conversion device according to one of the embodiments of the present invention is applied. Three half-bridge circuits 60a, 60b, 60c are connected in parallel with each other. The high-potential terminals 62a, 62b, 62c of the three half-bridge circuits 60a, 60b, 60c are connected to each other to form a high-potential terminal externally connected to a first direct current power supply 64 on the high-potential side of the same. The low-potential terminals 63a, 63b, 63c of the three half-bridge circuits 60a, 60b, 60c are connected to each other to form a low-potential terminal externally connected to the first direct current power supply 64 on the low-potential side of the same. The central connection terminals 61a, 61b, 61c of the three half-bridge circuits 60a, 60b, 60c are externally connected respectively to different terminals of a three-phase load 66.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2006-209532, filed on Aug. 1, 2006 including specification, claims, drawings and summary, on which the Convention priority of the present application is based, are incorporated herein by reference in its entirety.

What is claimed is:

1. A power conversion device, comprising:
   an insulated gate bipolar transistor; and
   a protective circuit, the protective circuit including
      first and second Zener diodes connected in series in directions opposite to each other between a gate and a current sense terminal of the insulated gate bipolar transistor, and
      third and fourth Zener diodes connected in series in directions opposite to each other between the gate and an emitter of the insulated gate bipolar transistor.

2. The power conversion device according to claim 1, wherein the protective circuit comprises:
   an NMOS transistor having a gate connected to the current sense terminal of the insulated gate bipolar transistor, a source connected to the emitter of the insulated gate bipolar transistor, and a drain connected to the gate of the insulated gate bipolar transistor; and
   a first resistor connected between the current sense terminal and the emitter of the insulated gate bipolar transistor.

3. The power conversion device according to claim 2, wherein the protective circuit comprises a first diode connected between the gate of the insulated gate bipolar transistor and the drain of the NMOS transistor.

4. The power conversion device according to claim 2, wherein the protective circuit comprises a second resistor connected between the current sense terminal of the insulated gate bipolar transistor and the gate of the NMOS transistor.

5. The power conversion device according to claim 1, wherein the protective circuit comprises:
   a first diode group formed of a plurality of diodes connected in series between the current sense terminal and the emitter of the insulated gate bipolar transistor; and
   a second diode group which is formed of a plurality of diodes connected in series, and which is connected in parallel with the first diode group in a direction opposite to a direction of connection of the first diode group.

6. The power conversion device according to claim 1, wherein the protective circuit comprises:
   a first diode group formed of a plurality of diodes connected in series between the current sense terminal and the emitter of the insulated gate bipolar transistor; and
   a second single diode connected in parallel with the first diode group in a direction opposite to a direction of connection of the first diode group.

7. The power conversion device according to claim 1, wherein the protective circuit comprises fifth and sixth Zener diodes connected in series in directions opposite to each other between the current sense terminal and the emitter of the insulated gate bipolar transistor.

8. The power conversion device according to claim 2, wherein the protective circuit comprises an external resistor or an external capacitor connected in parallel with the first resistor.

9. A power conversion device, comprising:
   an insulated gate bipolar transistor; and
   a protective circuit, the protective circuit including
      a first diode group formed of a plurality of diodes connected in series between a gate and a current sense terminal of the insulated gate bipolar transistor,
      a second diode group which is formed of a plurality of diodes connected in series, and which is connected in parallel with the first diode group in a direction opposite to a direction of connection of the first diode group,
      a third diode group formed of a plurality of diodes connected in series between the gate and an emitter of the insulated gate bipolar transistor, and
      a fourth diode group which is formed of a plurality of diodes connected in series, and which is connected in parallel with the third diode group in a direction opposite to a direction of connection of the third diode group.

10. The power conversion device according to claim 1, wherein the current sense terminal of the insulated gate bipolar transistor is connected to an external terminal.

11. The power conversion device according to claim 1, further comprising a temperature measuring diode in a vicinity of the insulated gate bipolar transistor, wherein the protective circuit has a third diode having a cathode connected to an anode of the temperature measuring diode, and an anode connected to a cathode of the temperature measuring diode.

* * * * *